US012672237B2

(12) United States Patent　(10) Patent No.:　US 12,672,237 B2

Kim　(45) Date of Patent:　Jun. 30, 2026

(54) DISPLAY APPARATUS

(71) Applicant: LG Display Co., Ltd., Seoul (KR)

(72) Inventor: Minwoo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 291 days.

(21) Appl. No.: 18/505,402

(22) Filed: Nov. 9, 2023

(65) Prior Publication Data

US 2024/0196536 A1　Jun. 13, 2024

(30) Foreign Application Priority Data

Dec. 8, 2022　(KR) ........................ 10-2022-0170180

(51) Int. Cl.
H05K 1/14　(2006.01)

(52) U.S. Cl.
CPC ............. H05K 1/147 (2013.01); H05K 1/142 (2013.01); H05K 2201/10128 (2013.01)

(58) Field of Classification Search
CPC ................... H05K 1/147; H05K 1/142; H05K 2201/10128
USPC .......................................................... 361/748
See application file for complete search history.

(56) References Cited

U.S. PATENT DOCUMENTS

| 9,801,278 | B2 | 10/2017 | Lee et al. | |
| 2016/0165726 | A1 | 6/2016 | Lee et al. | |
| 2020/0154572 | A1 | 5/2020 | Choi et al. | |
| 2020/0214127 | A1* | 7/2020 | Choi | H05K 1/189 |
| 2020/0286416 | A1 | 9/2020 | Huang et al. | |
| 2020/0286922 | A1* | 9/2020 | Huang | H10D 86/60 |
| 2020/0315015 | A1* | 10/2020 | Kim | G09G 3/20 |
| 2021/0036092 | A1* | 2/2021 | Yamato | H05K 1/189 |
| 2024/0078947 | A1* | 3/2024 | Koh | G09G 3/20 |

FOREIGN PATENT DOCUMENTS

| CN | 111665654 | A | 9/2020 |
| KR | 10-2017-0071105 | A | 6/2017 |
| KR | 10-2020-0054732 | A | 5/2020 |
| KR | 10-2135232 | B1 | 7/2020 |

* cited by examiner

*Primary Examiner* — Binh B Tran

(74) *Attorney, Agent, or Firm* — Fenwick & West LLP

(57) ABSTRACT

A display apparatus includes a display panel including a frontside, a backside, a first side extended along a first direction and a second side extended along a second direction intersecting the first direction, a chip-on-film attached to the frontside of the display panel at the first side, and a source printed circuit board connected to the chip-on-film, wherein the first side is curved in a thickness direction of the display panel, the source printed circuit board includes a third side extended along the second direction and a fourth side extended along the first direction, the fourth side having a length that is shorter than a length of the third side.

20 Claims, 17 Drawing Sheets

FIG. 7

DISPLAY APPARATUS

CROSS REFERENCE TO RELATED APPLICATION

The present application claims priority to Republic of Korea Patent Application No. 10-2022-0170180, filed Dec. 8, 2022, which is hereby incorporated by reference in its entirety.

BACKGROUND

Field of Technology

This specification relates to a display apparatus.

Description of the Related Art

Recently, flat panel displays have been enlarged as they are used as television receivers. As flat panel displays have become larger, an issue has arisen where the difference in picture quality becomes more pronounced depending on the viewing angle.

To address this issue, curved display apparatuses with a concave or convex shape, incorporating a curved surface, have been proposed as a solution. Curved display apparatuses are able to have a curved shape because the substrate of the display panel, where the image is displayed, is made of a flexible material.

SUMMARY

This specification aims to provide a display apparatus capable of improving the drive failure caused by bending of the source printed circuit board and minimize or at least reduce the stress applied to the display panel.

The objects of the present invention are not limited to the aforesaid, and other objects not described herein with be clearly understood by those skilled in the art from the descriptions below.

In order to accomplish the above objects, a display apparatus according to an embodiment includes a display panel including a frontside, a backside, a first side extended along a first direction and second side extended along a second direction intersecting the first direction, a chip-on-film attached to the frontside of the display panel at the first side, and a source printed circuit board connected to the chip-on-film, wherein the first side is curved in a thickness direction of the display panel, the source printed circuit board includes a third side extended along the second direction and a fourth side extended along the first direction, the fourth side having a length shorter than a length of the third side.

In order to accomplish the above objects, a display apparatus according to another embodiment includes a display panel including a frontside, a backside, a first side extended along a first direction and a second side extended along a second direction intersecting the first direction, a first chip-on-film attached to the frontside of the display panel at the first side, a second chip-on-film attached to the frontside of the display panel at the first side and spaced apart from the first chip-on-film in the first direction, a first source printed circuit board connected to the first chip-on-film, and a second source printed circuit board connected to the second chip-on-film, wherein the first side is curved in a thickness direction of the display panel, the first source printed circuit board includes a third side extended along the second direction and a fourth side extended along the first direction, the fourth side having a length shorter than a length of the third side.

The detailed descriptions of other embodiments are included in the specifications and drawings.

According to the embodiments, it is possible to provide a display apparatus that is capable of improving the drive failure caused by bending of the source printed circuit board and minimize the stress applied to the display panel.

According to the embodiments of this specification, it is possible to provide a long-lasting, low-power display apparatus by improving the drive failure caused by bending of printed circuit boards.

The advantages according to the embodiments are not limited to the aforesaid, and a variety of other advantages are included within the specification.

BRIEF DESCRIPTION OF THE DRA WINGS

FIG. 7 is a cross-sectional view of a curved state of the display apparatus of FIG. 6 according to an embodiment;

DETAILED DESCRIPTION

Figure 1:
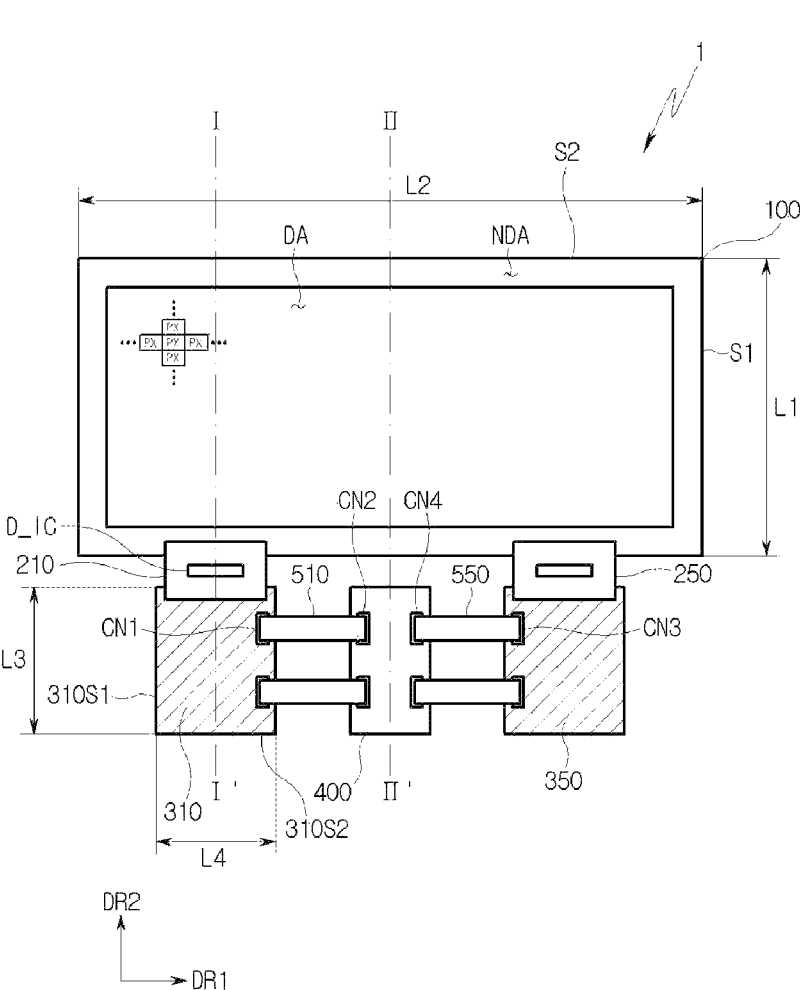
FIG. 1 is a plan view of a display apparatus according to an embodiment.

Advantages and features disclosed in this specification and methods of accomplishing the same may be understood more readily by reference to the detailed description of embodiments that will be made hereinafter with reference to the accompanying drawings. However, this specification may be embodied in many different forms and should not be construed as being limited to the exemplary embodiments set forth herein; rather, these exemplary embodiments are provided so that this specification will be thorough and complete and will fully convey the concept of the invention to those skilled in the art, and the scope of the specification will be defined solely by the appended claims.

When it is mentioned that one device or layer is located on another device or layer, it may be understood that one device or layer is directly located on the other device or layer or that still other device or layer is interposed between the two devices or layers. Throughout the specification, the same reference numerals refer to the same components. The shapes, sizes, ratios, angles, numbers and the like disclosed in the drawings to describe embodiments are merely exemplary, and thus, this specification is not limited thereto.

Although the terms "first", "second", and the like are used for describing various components, these components are not confined by these terms. These terms are merely used for distinguishing one component from the other components. Accordingly, a first component mentioned earlier may also be a second component within the technical spirit of the present invention.

The various features of the embodiments of the present invention can combined or assembled together, either partially or entirely, in a technically diverse manner, and each embodiment can be independently implemented or in conjunction with related embodiments.

Hereinafter, exemplary embodiments of the present invention will be described in detail with reference to accompanying drawings.

FIG. 1 is a plan view of a display apparatus according to an embodiment;

With reference FIG. 1, the display apparatus 1 according to an embodiment may refer to any electronic device that provides a display screen. Examples of the display apparatus 1 may include not only portable electronic devices such as mobile phones, smartphones, tablet personal computers (PCs), electronic watches, smartwatches, watch phones, mobile communication terminals, electronic notebooks, electronic books (e-books), portable multimedia players (PMPs), navigation devices, game consoles, digital cameras, but also other forms of equipment such as televisions, laptops, monitors, equipment display apparatuses including automotive display apparatuses or other forms of devices used in vehicles, advertising boards, and Internet of Things (IOT) devices that are equipped with a display screen.

According to an embodiment, the display apparatus 1 may include a display panel 100, chip-on-films 210 and 250 connected to the display panel 100, data driving circuits D_IC mounted on the chip-on-films 210 and 250, source printed circuit boards 310 and 350 connected to the chip-on-films 210 and 250, a control printed circuit board 400 connected to the source printed circuit boards 310 and 350, and cables 510 and 550 connecting the source printed circuit boards 310 and 350 and the control printed circuit board 400.

According to an embodiment of this specification, examples of the display panel 100 may include an organic light emitting diode (OLED) display panel, a micro light emitting diode (micro LED) display panel, a liquid crystal display (LCD) panel, a plasma display panel (PDP), an electrophoretic display panel, a microelectromechanical system (MEMS) display panel, electrowetting display panel, and etc. The display panel 100 may include long sides S2 extending in a first direction DR1 and short sides S1 extending in a second direction DR2. The short sides S1 may have a first length of L1, while the long sides S2 may have a second length of L2. The second length of L2 may be greater than the first length of L1. The planar shape of the display panel 100 may be a rectangle with rectangular corners where the long sides S2 and short sides S1 meet, but it is not limited to that specific shape and may have rounded rectangular, elliptical, circular, square, or any other polygonal shape where the long sides S2 and short sides S1 meet at their respective corners. The embodiments of this specification are not limited thereto. For the convenience of explanation, the description will be based on the assumption that the display panel 100 has a rectangular planar shape. Although the long sides S2 and short sides S1 of the display panel 100 are distinguished in FIG. 1 for the convenience of explanation, it is also possible to refer to the sides extended in the first direction DR1 as the first sides and the sides extended in the second direction DR2 as the second sides.

For example, the display panel 100 may include first sides extended in the first direction DR1 and second sides extended in the second direction DR2 intersecting with the first direction. The first sides may be bent in the thickness direction of the display panel 100.

The display panel 100 may include a display area DA and a non-display area NDA surrounding the display area DA. The display area DA may include a plurality of pixels PX that display images. The planar shape of the display area DA may be similar to the planar shape of the display panel 100, such as a rectangular shape, and the non-display area NDA may surround the display area DA. That is, the non-display area NDA may surround both the long sides S2 and short sides S1 of the display area DA. However, it is not limited to this configuration, and the non-display area NDA may also partially surround the display area DA. For example, the non-display area NDA surrounding the long side S2 on the opposite side of the second direction DR2 of the display area DA may accommodate the attachment of chip-on-films 210 and 250. The chip-on-film 210 and 250 may be provided in multiple quantities. The number of chip-on-films 210 and 250 is not limited according to an embodiment of this specification. In an embodiment of this specification, for the convenience, the example is provided with two chip-on-films 210 and 250. The chip-on-films 210 and 250 may include the first chip-on-film 210 and the second chip-on-film 250. The display panel 100 may include a frontside and a backside. On the front side of the display panel 100, the first and second chip-on-films 210 and 250 may be attached. The first chip-on-film 210 and the second chip-on-film 250 may be arranged to be spaced apart along the first direction DR1.

For example, the first chip-on-film 210 may be positioned on the left side (or the opposite side of the first direction DR1) with respect to the dividing line (–') that extends along the second direction DR2, dividing the display panel 100 in the first direction DR1, the second chip-on-film 250 may be positioned on the right side (or the other side of the first direction DR1) with respect to the dividing line (–'). The chip-on-films 210 and 250 may include flexible printed circuit boards. Each chip-on-films 210 and 250 may be bent from the frontside of the display panel 100.

The chip-on-films 210 and 250, which are flexible in nature, may be initially attached at one end thereof to the frontside of the non-display area NDA of the display panel 100 and bent and positioned at the other end thereof on the backside of the display panel 100. Each of the chip-on-films 210 and 250 may have a data driving circuit D_IC embedded. The data driving circuit D_IC may be provided in the form of a driver chip, and the data driving circuit D_IC provided in the form of a driver chip may be embedded in each of the chip-on-films 210 and 250.

The opposite ends of the chip-on-films 210 and 250 may accommodate the attachment of source printed circuit boards 310 and 350. The chip-on-films 210 and 250 may be multiple in quantity. The source printed circuit boards 310 and 350 may be present in multiple quantities. Multiple source printed circuit boards 310 and 350 may include the first source printed circuit board 310 and the second source printed circuit board 350.

The quantity of chip-on-films 210 and 250 and source printed circuit boards 310 and 350 may be two or more. The quantity of chip-on-films 210 and 250 and the quantity of source printed circuit boards 310 and 350 may be the same. The quantity of chip-on-films 210 and 250 and the quantity of source printed circuit boards 310 and 350 may vary depending on the size of the display panel 100.

The first source printed circuit board 310 may be connected to the first chip-on-film 210, and the second source printed circuit board 350 may be connected to the second chip-on-film 250. The control printed circuit board 400 to be described later includes a timing controller that transfers image data received from the host system to the first and second source printed circuit boards 310 and 350. The timing controller receives timing signals synchronized with pixel data and generates data timing control signals to control the operation timing of the data driving circuit D_IC and gate timing control signals to control the operation timing of the gate driver of the non-display area NDA of the display panel 100.

The first and second source printed circuit boards 310 and 350 transmit timing control signals and image data received from the control printed circuit board 400 to the data driving circuit D_IC.

The data driving circuit D_IC operates the display panel 100 based on the timing control signals and image data received from the source printed circuit boards 310 and 350. The data driving circuit D_IC includes a digital-to-analog converter (DAC) that converts the image data into analog data voltages. The DAC generates voltages of the data signal by converting the pixel data into gamma correction voltages.

As described above, the first and second source printed circuit boards 310 and 350 may be connected to the control printed circuit board 400 via cables 510 and 550 to receive the timing control signals and image data from the control printed circuit board 400.

Meanwhile, the planar shape of each source printed circuit boards 310 and 350 may have a rectangular shape including the long sides 310S1 and the short sides 310S2. However, the planar shape of the source printed circuit boards 310 and 350 is not limited thereto and may also have a circular, elliptical, or other polygonal shapes. The embodiments of this specification are not limited thereto. For the convenience of explanation, the following description will be made on the basis of the planar shape of each of the source printed circuit boards 310 and 350 having a rectangular shape including the long sides 310S1 and the short sides 310S2. The long sides 310S1 may have a third length of L3, and the short sides 310S2 may have a fourth length of L4. The third length of L3 may be greater than the fourth length of L4. Although the long sides 310S1 and short sides 310S2 of the source printed circuit boards 310 and 350 are distinguished in FIG. 1 for the convenience of explanation, it is also possible to refer to the sides extended along the first direction DR1 as the fourth sides and the sides extended along the second direction DR2 as the third sides.

For example, the source printed circuit board 310 may include the fourth sides extended in the first direction DR1 and the third sides extended in the second direction DR2 intersecting with the first direction.

The first sides extended along the first direction DR1 of the display panel 100 may be bent in the thickness direction of the display panel 100.

The third and fourth sides of the source printed circuit board 310 may have different lengths. The length of the fourth side may be shorter than the length of the third side.

The second source printed circuit board 350 includes the fifth side extended along the second direction DR2 and the sixth side extended along the first direction DR1, and the length of the sixth side may differ from the length of the fifth side.

When the chip-on-films 210 and 250 are unfolded and not bent towards the backside of the display panel 100, the control printed circuit board 400 may be positioned between the first source printed circuit board 310 and the second source printed circuit board 350.

The cables 510 and 550 may be provided in multiple quantities. The cables 510 and 550 may include the first cable 510 connecting the first source printed circuit board 310 to the control printed circuit board 400, and the second cable 550 connecting the second source printed circuit board 350 to the control printed circuit board 400. The first cable 510 and the second cable 550 may each be provided in multiple quantities. The plurality of first cables 510 may be spaced apart from each other in the second direction DR2, and the plurality of second cables 550 may also be spaced apart from each other in the second direction DR2.

The first cable 510 and the second cable 550 may have a line shape extended along the first direction DR1.

The opposite end of the first cable 510 in the first direction DR1 is connected to the first connector CN1 of the first source printed circuit board 310, and the other end of the first cable 510 in the first direction DR1 may be connected to the second connector CN2 of the control printed circuit board 400. In the following description, the term "other end in the first direction DR1 refers to the right side based on the plan view of FIG. 1, and the term "opposite end in the first direction DR1" refers to the left side based on the plan view of FIG. 1.

The opposite end of the second cable 550 in the first direction DR1 is connected to the fourth connector CN4 of the control printed circuit board 400, and the other end of the second cable 550 in the first direction DR1 may be connected to the third connector CN3 of the second source printed circuit board 350.

Figure 2:
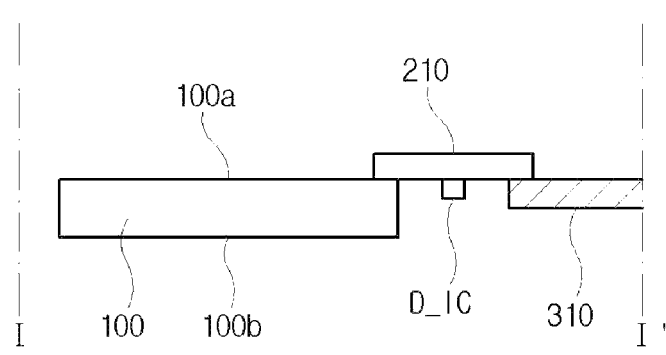
FIG. 2 is a cross-sectional view taken along the line I-I' in FIG. 1 according to an embodiment.
Figure 2:
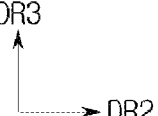

FIG. 2 is a cross-sectional view taken along line I-I' of FIG. 1 according to an embodiment.

Figure 3:
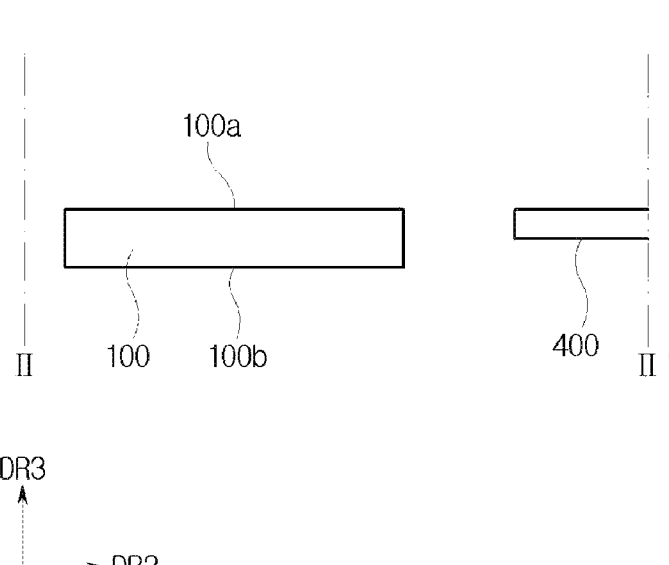
FIG. 3 is a cross-sectional view taken along the line II-II' in FIG. 1 according to an embodiment.

FIG. 3 is a cross-sectional view taken along the line II-II' in FIG. 1 according to an embodiment.

As shown in FIG. 2, the display panel 100 may include a frontside 100a and a backside 100b opposite to the frontside 100a. The frontside 100a of the display panel 100 may be the surface emitting light generated by the plurality of pixels PX. The opposite end of the first chip-on-film 210 in the second direction DR2 is attached to the frontside 100a of the display panel 100, and the other end of the first chip-on-film 210 in the second direction DR2 may be attached to the first source printed circuit board 310. The data driving circuit D_IC may be placed on the underside the chip-on-film 210.

As shown in FIG. 3, in the state where the chip-on-films 210 and 250 are unfolded and not bent, the source printed circuit boards 310 and 350 may not be positioned between the control printed circuit board 400 and the display panel 100. For example, the cables 510 and 550 connecting the control printed circuit board 400 and the source printed circuit boards 310 and 350 may extend along the first direction DR1 to connect the adjacent control printed circuit board 400 and source printed circuit boards 310 and 350 along the first direction DR1.

Figure 4:
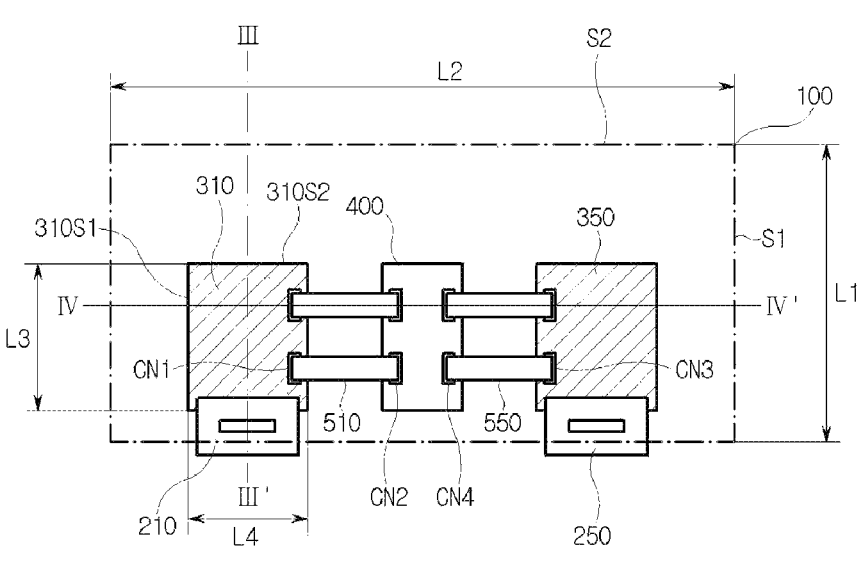
FIG. 4 is a plan view illustrating a bent state of first and second chip-on-films shown in FIG. 1 according to an embodiment.
Figure 4:
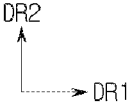
Figure 5:
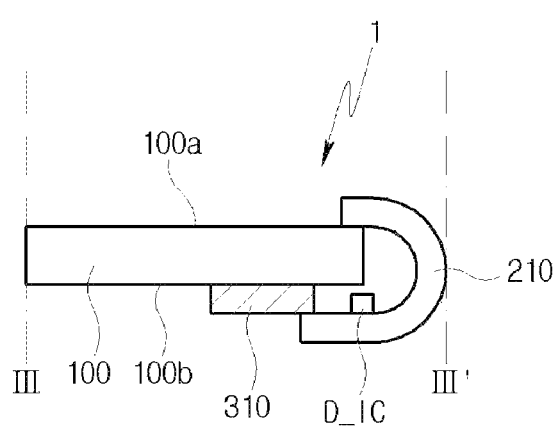
FIG. 5 is a cross-sectional view taken along the line III-III' in FIG. 4 according to an embodiment.
Figure 5:
Figure 6:
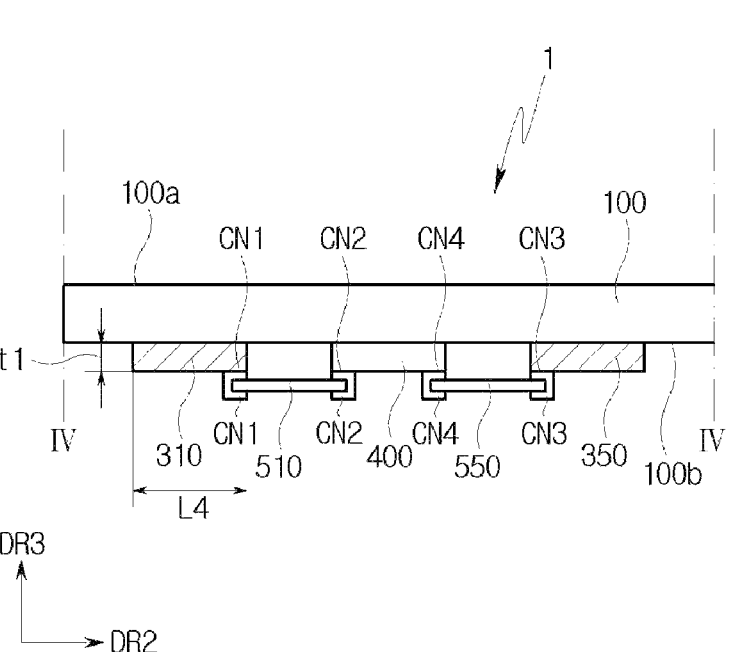
FIG. 6 is a cross-sectional view taken along the line IV-IV' in FIG. 4 according to an embodiment.

FIG. 4 is a plan view illustrating a bent state of first and second chip-on-films shown in FIG. 1 according to an embodiment. FIG. 5 is a cross-sectional view taken along the line III-III' in FIG. 4 according to an embodiment. FIG. 6 is a cross-sectional view taken along the line IV-IV' in FIG. 4 according to an embodiment:

With reference to FIGS. 4 to 6, the chip-on-films 210 and 250 may be bent in the thickness direction. For example, one ends (e.g., first ends) of the chip-on-films 210 and 250 may be connected to the display panel 100, while the other ends (e.g., second ends) may be connected to the source printed circuit boards 310 and 350. One ends of the chip-on-films 210 and 250 may be electrically connected to the display panel 100. The other ends of the chip-on-films 210 and 250 may be electrically connected to the source printed circuit boards 310 and 350. By bending the chip-on-films 210 and 250, the other ends of the chip-on-films 210 and 250 and the source printed circuit boards 310 and 350 may be positioned on the backside of the display panel 100. The chip-on-films 210 and 250 may be formed in a rectangular shape and made of a flexible material to allow for bending. As shown in FIG. 6, the source printed circuit boards 310 and 350, the control printed circuit board 400, and the cables 510 and 550 may be positioned on the backside 100b of the display panel 100.

The source printed circuit boards 310 and 350 may each have a thickness of t1.

Figure 7:
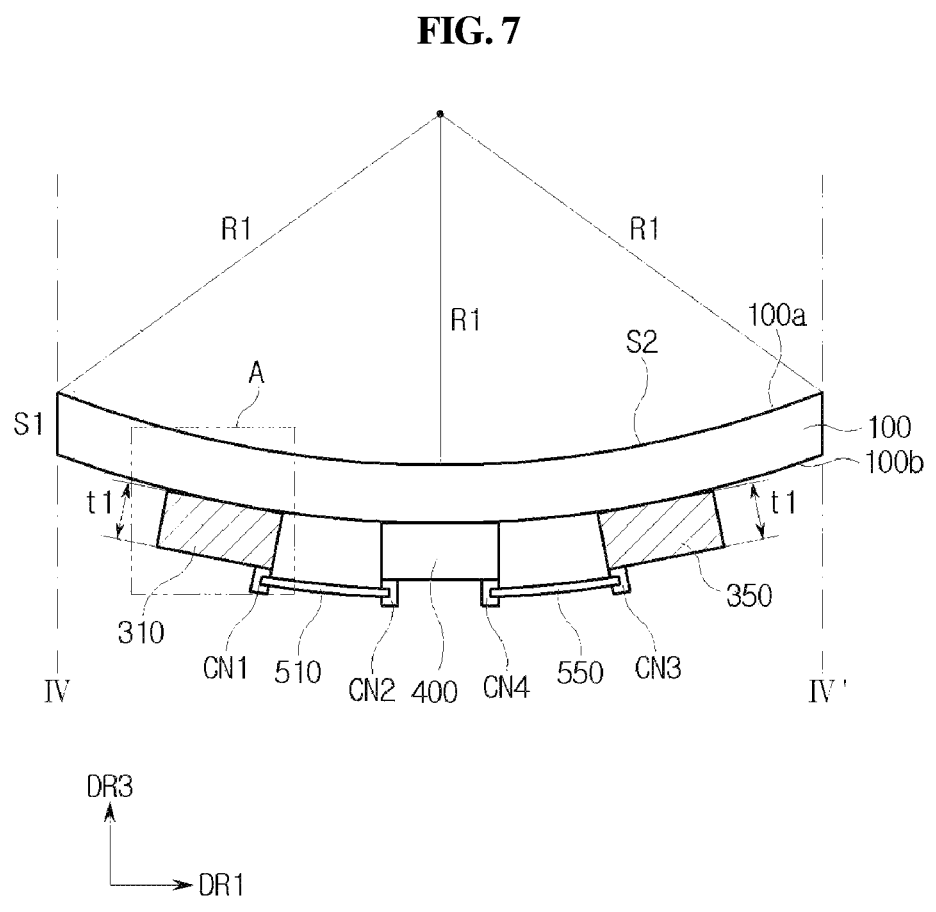
Figure 8:
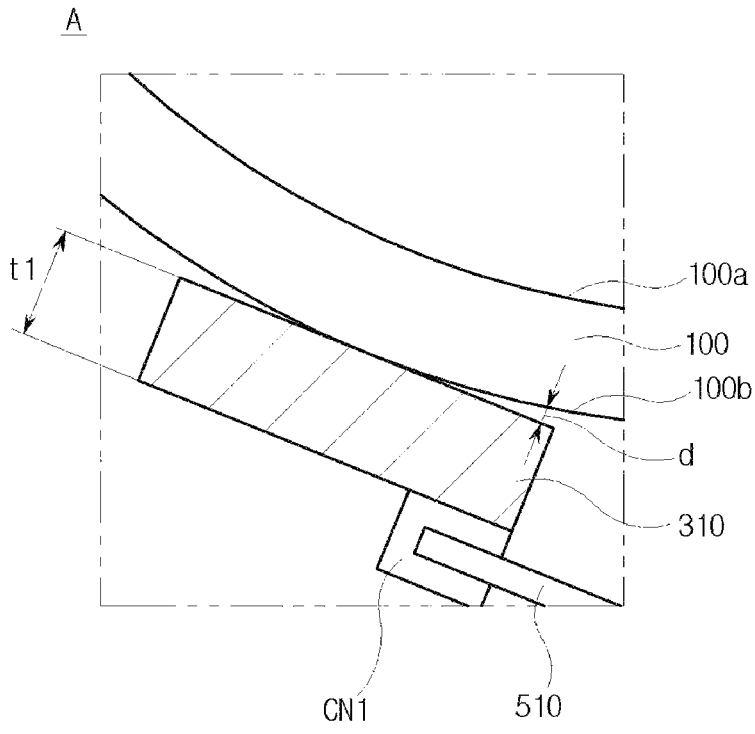
FIG. 8 is an enlarged cross-sectional view of area A in FIG. 7 according to an embodiment.

FIG. 7 is a cross-sectional view of a curved state of the display apparatus of FIG. 6 according to an embodiment. FIG. 8 is an enlarged cross-sectional view of area A of FIG. 7 according to an embodiment.

With reference to FIGS. 7 and 8, the display panel 100 may be curved to have a first radius of curvature R1. When curved, the frontside 100a of the display panel 100 is positioned on the inner side, while the backside 100b is positioned on the outer side, while the frontside 100a of the display panel 100 having a first radius of curvature R1 and the backside 100b having a larger radius of curvature than the first radius of curvature R1. The whole area of the frontside 100a of the display panel 100 may have the same first curvature radius R1. The display panel 100 may be curved (or bent) in the third direction DR3. The display panel 100 may be bent in the direction towards the one side of the third direction DR3. For example, the display panel 100 may be bent in the direction from the backside 100b towards the frontside 100a.

Furthermore, the display panel 100 may have the long side S2 bent in the third direction DR3, while the short side S1 may not be bent.

With reference to FIGS. 4 and 7, the length LA of the short side 310S2 of the source printed circuit boards 310 and 350 in the same direction as the long sides S2 of the display panel 100 that are curved (bent) may be shorter compared to the vertical long sides 310S1. The control printed circuit board 400 may have shorter sides in the same direction as the long sides S2 of the display panel 100 that are curved (bent) compared to the vertical sides. For example, the length of the seventh side of the control printed circuit board 400 that extends along the first direction DR1 may be shorter than the length of the eighth side that extends along the second direction DR2.

The plurality of connectors CN1, CN2, CN3, and CN4 may be arranged in the second direction DR2, which is perpendicular to the long sides S2 of the display panel 100 that are curved (bent).

Such a configuration prevents cracks and damages to the source printed circuit boards 310 and 350, the plurality of connectors CN1, CN2, CN3, and CN4, and the control printed circuit board 400 caused by the curving (bending) operation of the display panel 100, ensuring the structural stability of the display apparatus 1 and improving screen drive failure.

While the display panel 100 is curved, as shown in FIGS. 7 and 8, the source printed circuit boards 310 and 350 placed on the backside 100b of the display panel 100 may actually not be curved as they include a more rigid material compared to the substrate of the display panel 100. In an embodiment of the specification, when it is said that the source printed circuit boards 310 and 350 are not actually curved, this means that the degree of curving of the source printed circuit boards is less than ⅒th of the degree of curving of the display panel 100, or the curvature radius of the source printed circuit boards is more than 10 times of the first curvature radius R1 of the display panel 100. Accordingly, as shown in FIG. 8, there may be a certain distance d between the backside 100b of the display panel 100 and the frontside of the source printed circuit board 310. The frontside of the source printed circuit board 310 at the center thereof may be in contact with the backside 100b of the display panel 100, while the frontside of the source printed circuit board 310 at the outer edges thereof may be spaced apart from the backside 100b of the display panel 100.

For example, in the case of the source printed circuit boards 310 and 350 that are not actually curved compared to the display panel 100, bending stress may occur as a result of the curvature of the display panel 100. This may lead to physical damage such as cracks in the source printed circuit boards 310 and 350. As a result, the display apparatus 1 may experience drive failures. Furthermore, cracks in the source printed circuit boards 310 and 350 may be transmitted to the display panel 100, potentially causing physical damage to the display panel 100.

In an embodiment, the source printed circuit boards 310 and 350 of the display apparatus 1 may be configured to have the length L4 of the sides 310S2 extended in the first direction DR1 to be smaller than the length L3 of the long side 310S1 extended in the second direction DR2 as shown in FIGS. 4 and 7 in order to minimize the bending stress on the rigid source printed circuit boards 310 and 350. Assuming that the area of the source printed circuit boards remains the same, the advantage of having LA shorter than L3 is that it allows for minimizing or at least reducing the bending stress caused by the bending of the display panel 100.

For example, the length L3 can be approximately 1.3 to 1.5 times of the length LA. When the length L3 is approximately 1.3 times or more of the length LA, it allows for easy securing of the space for cables 510 and 550 connecting the control printed circuit board 400 and the adjacent source printed circuit boards 310 and 350, and when the length L3 is approximately 1.5 times or less of the length LA, the source printed circuit boards 310 and 350 may be placed within one side (or short side S1) of the backside 100b in the second direction DR2, preventing interference during assembly. The length L3 of the long side 310S1 of the source printed circuit boards 310 and 350 may be smaller than the length L1 of the short side S1 of the display panel 100.

The lengths L3 and L4 of the source printed circuit boards 310 and 350 may vary depending on the design of the display panel 100, specifically the length L1 of the short sides and the length L2 of the long sides. The embodiments of this specification are not limited thereto.

Figure 9:
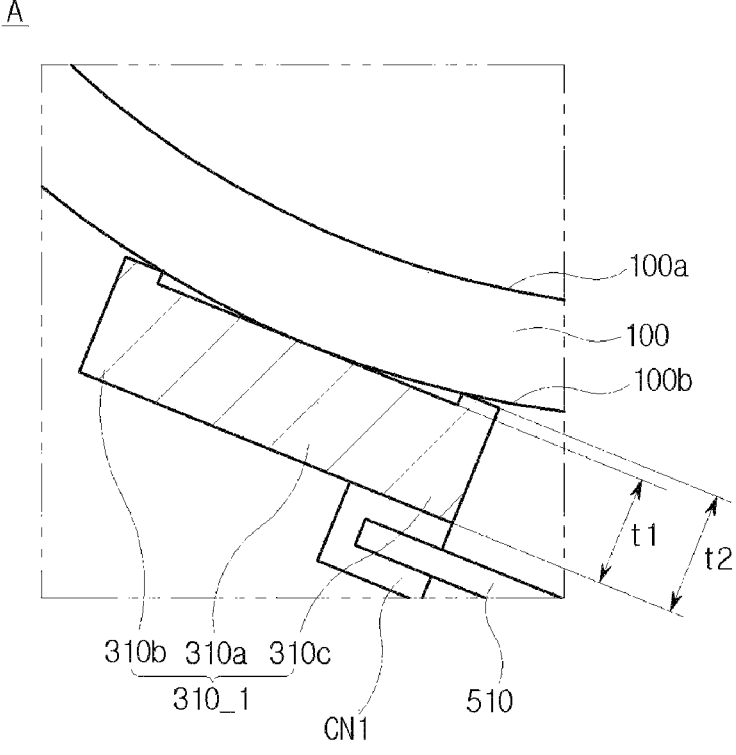
FIG. 9 is cross-sectional view of a first source printed circuit board according to another embodiment according to an embodiment.

FIG. 9 is cross-sectional view of a first source printed circuit board according to another embodiment.

With reference to FIG. 9, the first source printed circuit board 310_1 according to an embodiment of this specification may include a first portion 310*a*, a second portion 310*b*, and a third portion 310*c*. The first portion 310*a* may have a first thickness t1. The second portion 310*b* and the third portion 310*c* may each have a second thickness t2 that is greater than the first thickness t1. The second thickness t2 may be formed to be larger than the first thickness t1 to reduce the separation distance d formed between the first source printed circuit board 310 and the backside 100*b* of the display panel 100 as described with reference to FIG. 8. (t1<t2)

The first portion 310*a* may be positioned between the second portion 310*b* and the third portion 310*c*. The first portion 310*a* may be located at the center of the first source printed circuit board 310_1. The second portion 310*b* and the third portion 310*c* may be positioned at the outer edges of the first source printed circuit board 310_1. The second portion 310*b* and the third portion 310*c* may directly contact the backside 100*b* by having the second thickness t2.

In an embodiment of this specification, the second portion 310*b* and the third portion 310*c* may minimize or at least reduce the bending stress caused by the curving of the display panel 100 by directly contacting the backside 100*b* and having the second thickness t2. By preventing damage to the display panel 100, the multiple connectors CN1, CN2, CN3, and CN4, and the control printed circuit board 400, it is possible to ensure the structural stability of the display apparatus 1.

Figure 10:
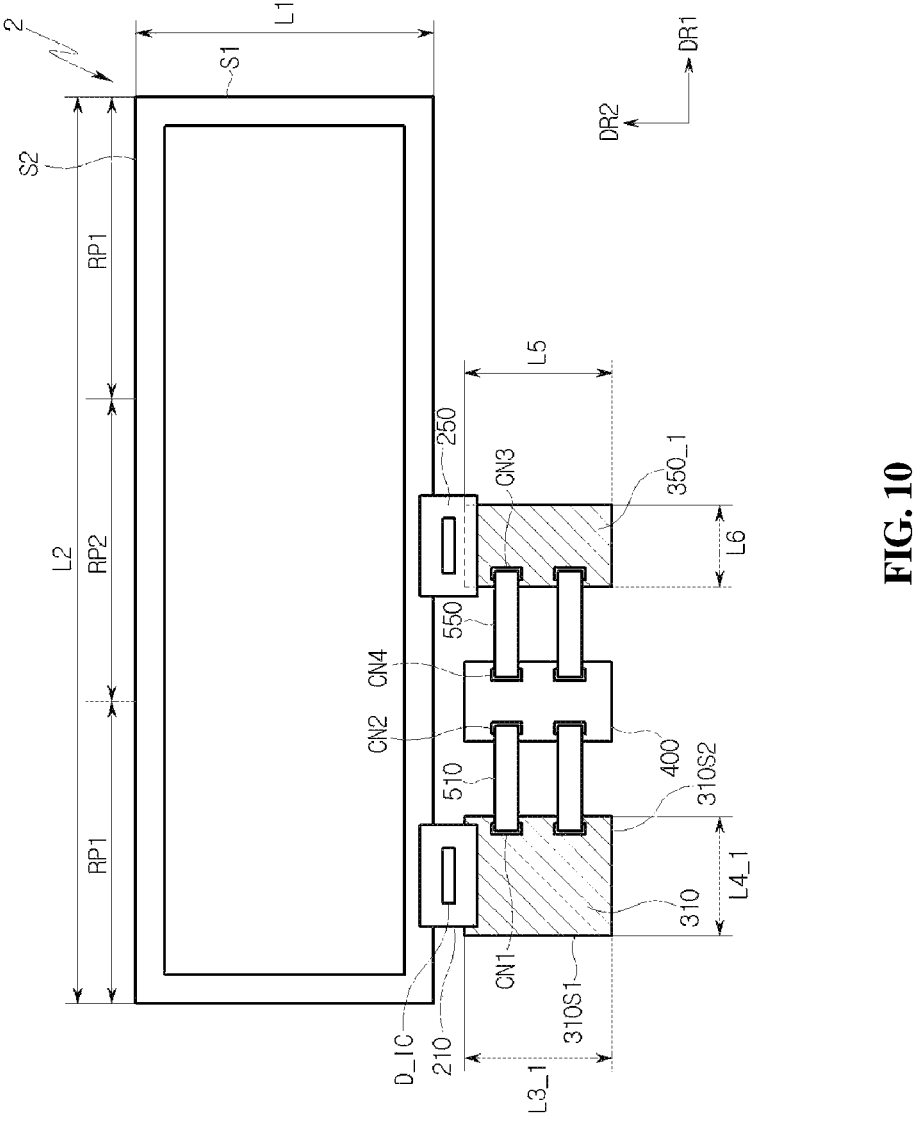
FIG. 10 is a plane view of a display apparatus according to another embodiment.
Figure 11:
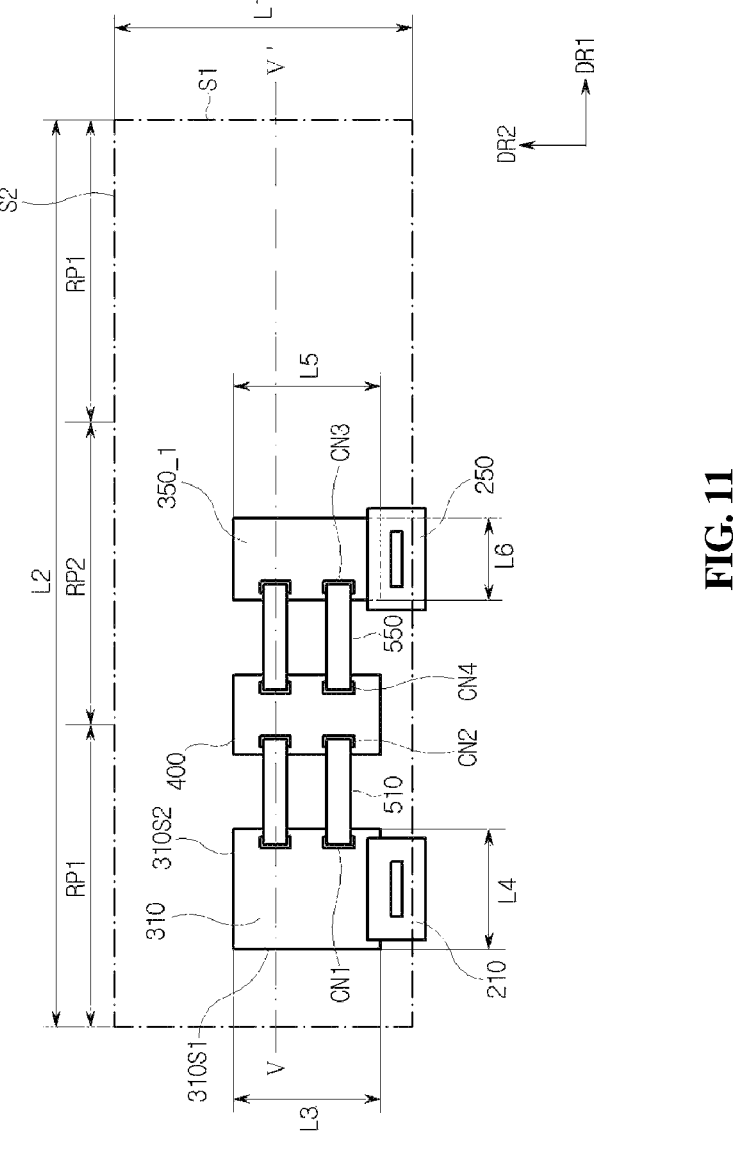
FIG. 11 is a plan view illustrating a bent state of first and second chip-on-films shown in FIG. 10 according to an embodiment.
Figure 12:
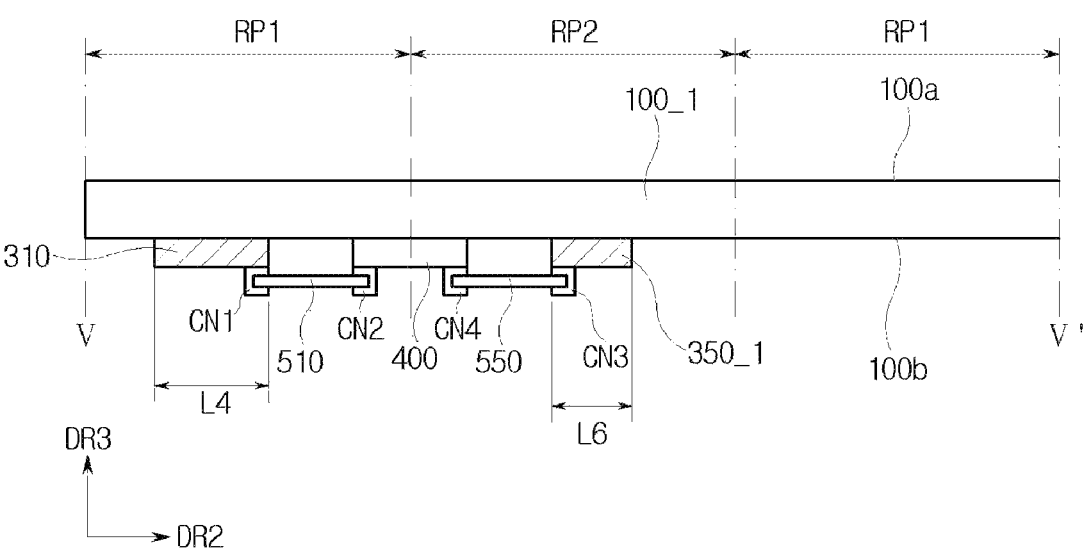
FIG. 12 is a cross-sectional view taken along the line V-V' in FIG. 11 according to an embodiment.
Figure 13:
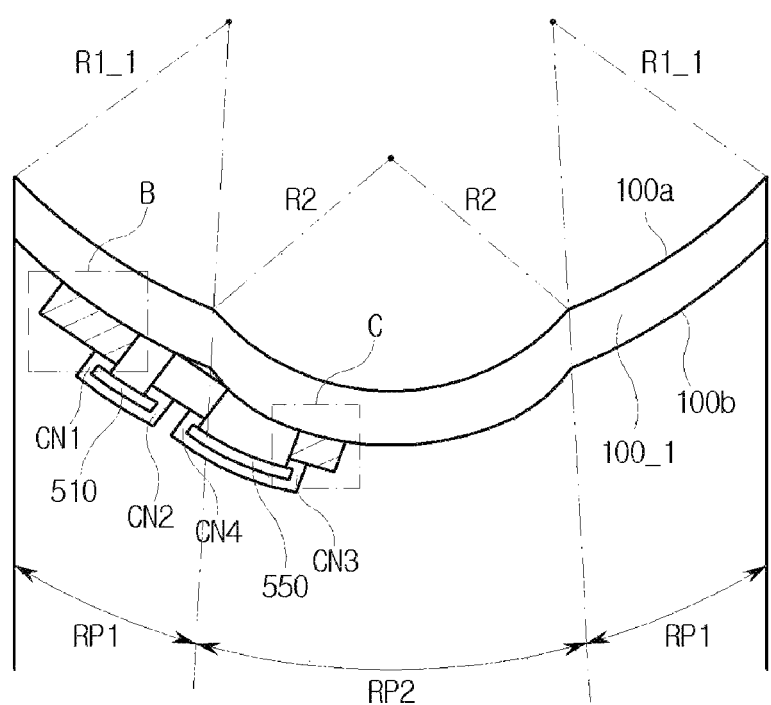
FIG. 13 is a cross-sectional view of a curved state of the display apparatus of FIG. 12 according to an embodiment.
Figure 14:
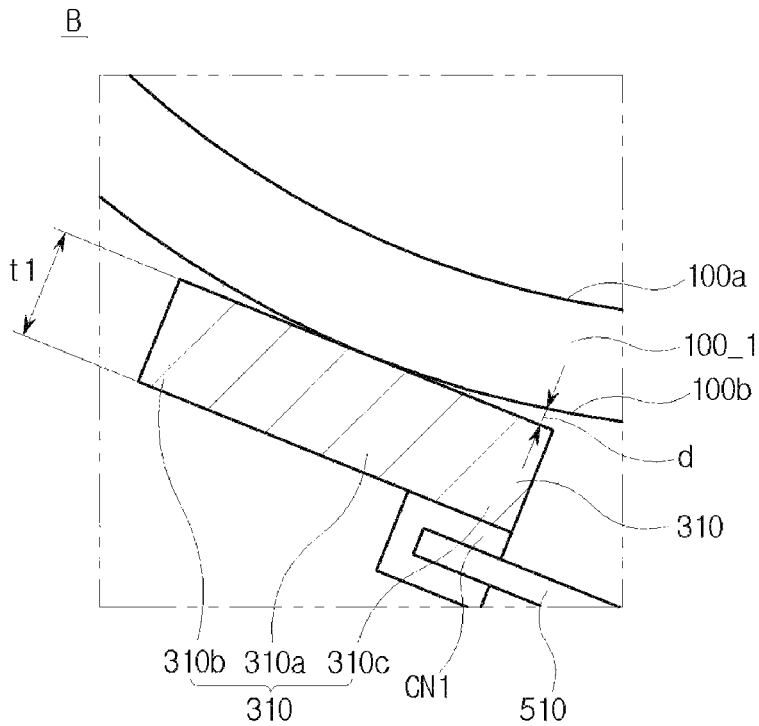
FIG. 14 is an enlarged cross-sectional view of area B in FIG. 13 according to an embodiment.
Figure 15:
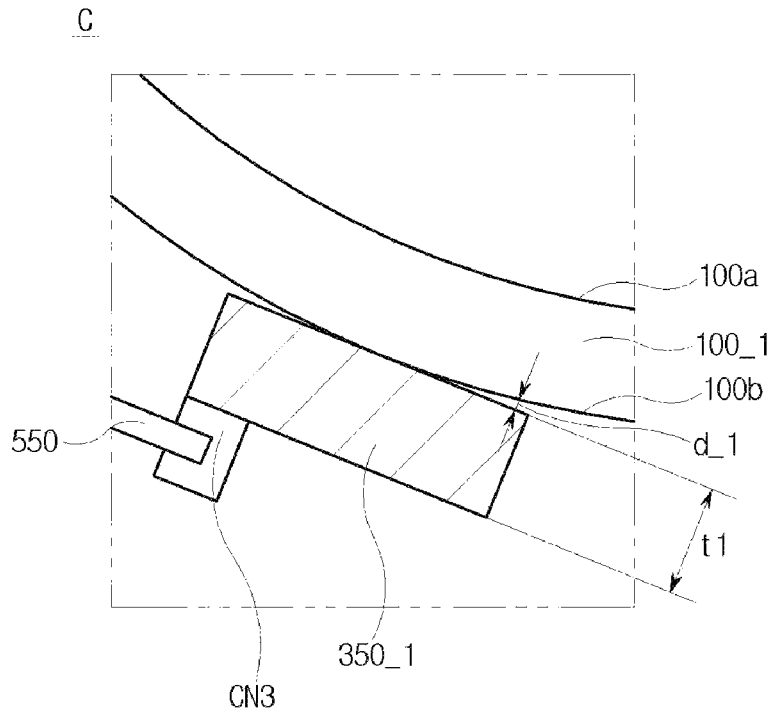
FIG. 15 is an enlarged cross-sectional view of area C in FIG. 13.

FIG. 10 is a plane view of a display apparatus according to another embodiment. FIG. 11 is a plan view illustrating a bent state of first and second chip-on-films shown in FIG. 10 according to an embodiment. FIG. 12 is a cross-sectional view taken along the line V-V' in FIG. 11 according to an embodiment. FIG. 13 is a cross-sectional view of a curved state of the display apparatus of FIG. 12 according to an embodiment. FIG. 14 is an enlarged cross-sectional view of area B in FIG. 13 according to an embodiment. FIG. 15 is an enlarged cross-sectional view of area C in FIG. 13 according to an embodiment.

With reference to FIGS. 10 to 15, the display apparatus 2 according to this embodiment differs to the display apparatus 1 of the previous embodiment in that the display panel is divided into a plurality of regions with different curvature radii RP1 and RP2. Redundant or repetitive description of the same configuration may be omitted or summarized.

In more detail, the display apparatus 2 may include first and second curvature regions RP1 and RP2 with different curvature radii. The first curvature region RP1 may correspond to a first curvature portion. The second curvature region RP2 may correspond to a second curvature portion. The first curvature region RP1 may have a first curvature radius R1_1, while the second curvature region RP2 may have a second curvature radius R2 different from the first curvature radius R1_1. The second curvature radius R2 may be smaller than the first curvature radius R1_1. The second curvature radius R2 may be larger than the first curvature radius R1_1. In this embodiment, the second curvature region RP2 is illustrated as being positioned between adjacent first curvature regions RP1 for the convenience of description, the arrangement of the first and second curvature regions RP1 and RP2 is not limited thereto. In the display apparatus 2 of FIGS. 10 to 15, the frontside 100*a* of a single display panel 100_1 includes multiple curved regions with different curvature radii. The second curved region RP2 may be positioned between adjacent first curved regions RP1 in the first direction DR1. In some alternative embodiments, the first curved region RP1 may be positioned between adjacent second curved regions RP2 in the first direction DR1.

The first chip-on-film 210 may be attached to the first curved region RP1 of the display panel, and the first source printed circuit board 310 may be attached to the other end of the first chip-on-film 210 as described with reference to FIG. 1.

The second chip-on-film 250 may be attached to the second curved region RP2 of the display panel, and the second source printed circuit board 350_1 may be attached to the other end of the second chip-on-film 250. Similar to FIG. 1, the control printed circuit board 400 is positioned between adjacent source printed circuit boards 310 and 350_1, and the control printed circuit board 400 may be connected to the adjacent source printed circuit boards 310 and 350_1 via corresponding cables 510 and 550, respectively.

The second source printed circuit board 350_1 includes the short sides extended along the first direction DR1 and the long sides extended along the second direction DR2, and the length L6 of the short sides may be smaller than the length L5 of the long sides. The length L5 may be the same as the length L3 of the first source printed circuit board 310. The length L6 may be different from the length LA. The length L6 may be smaller than the length L4. The lengths LA and L6 of the short sides of the source printed circuit boards 310 and 350_1 can vary depending on the curvature radii of the first and second curvature regions RP1 and RP2.

As shown in FIG. 11, the chip-on-films 210 and 250 may be bent in the thickness direction, similar to those in FIG. 4. As a result, as shown in FIG. 12, the first source printed circuit board 310 may be positioned on the backside 100*b* of the display panel within the first curved region RP1, while the second source printed circuit board 350_1 may be positioned on the backside 100*b* of the display panel within the second curved region RP2. The control printed circuit board 400 between the first source printed circuit board 310 and the second source printed circuit board 350_1 may be positioned across the first curved region RP1 and the second curved region RP2.

As shown in FIG. 13, the curvature radii R1_1 and R2 of the first curved region RP1 and the second curved region RP2 may differ from each other. The display panel 100_1 may be curved or bent in the direction toward the frontside 100*a*, and the curvature radii R1_1 and R2 shown in FIG. 13 may represent the curvature radii of the frontside 100*a* of the display panel 100_1. Since the second curvature radius R2 is smaller than the first curvature radius R1_1, the degree of curvature in the second curvature region RP2 of the display panel 100_1 may be greater than the degree of curvature in the first curvature region RP1.

As shown in FIGS. 14 and 15, the periphery of the first source printed circuit board 310 and the periphery of the second source printed circuit board 350_1 may have a certain distance d and d_1 from the backside 100*b*. When the first source printed circuit board 310 and the second source printed circuit board 350_1 have the short sides equal in length, the distance between the second source printed circuit board 350_1 and the backside 100*b* may be greater than the distance between the first source printed circuit board 310 and the backside 100*b*, because the second curvature region RP2 has a smaller curvature radius compared to the first curvature region RP1. In an embodiment of this specification, it is possible for the distances d and d_1 to be equal by designing the sixth length L6 to be smaller than the fourth length LA.

The degree of bending stress generated in bending the display panel 100_1 may be greater for the first printed circuit board 310 positioned in the first curvature region RP1 than for the second source printed circuit board 350_1 positioned in the second curvature region RP2.

However, in display apparatus 2 configured according to this embodiment, there is an advantage in reducing the bending stress generated in the second source printed circuit board 350_1 by designing the sixth length L6 to be smaller than the fourth length L4.

Figure 16:
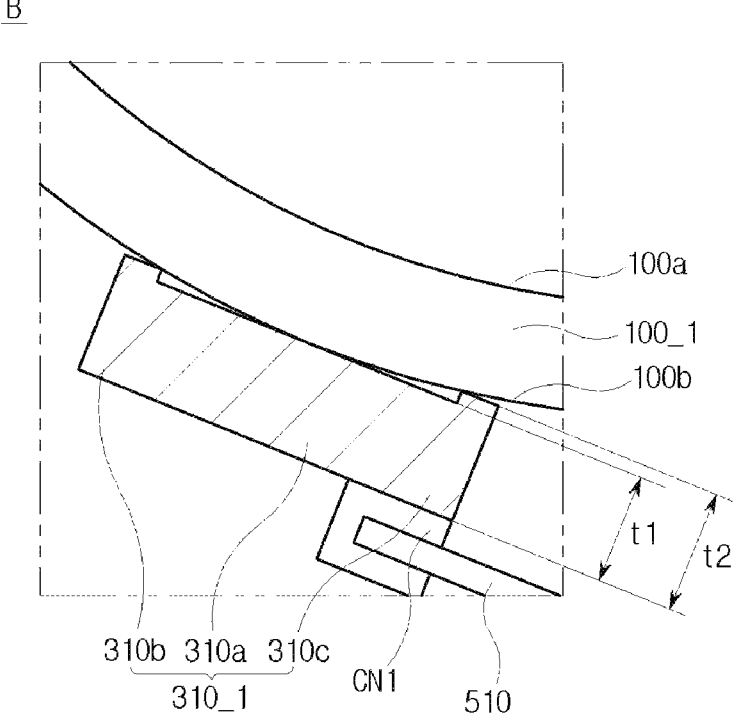
FIG. 16 is a cross-sectional view of a first source printed circuit board according to another embodiment.
Figure 17:
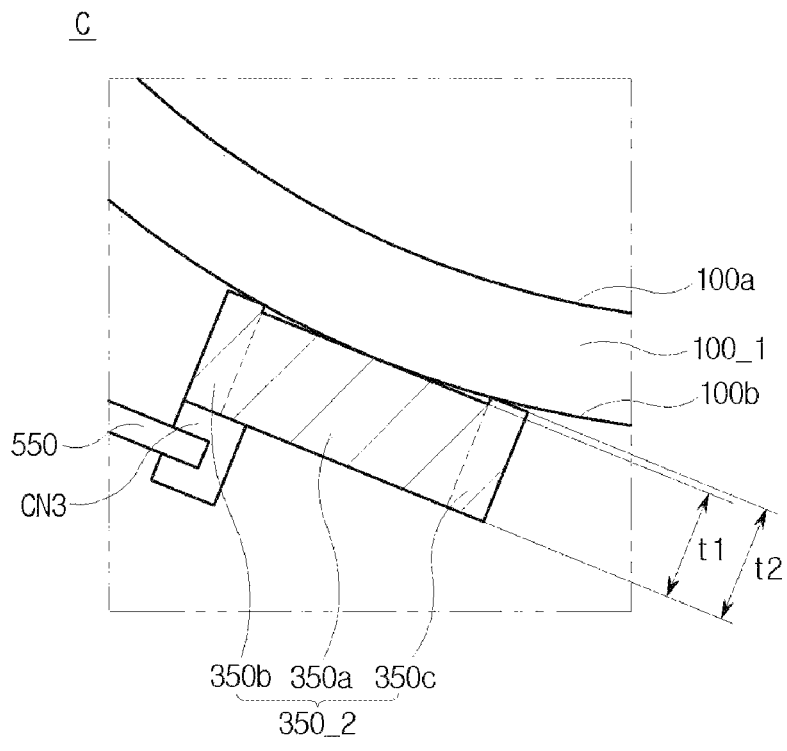
FIG. 17 is a cross-sectional view of a second source printed circuit board according to another embodiment.

FIG. 16 is a cross-sectional view of a first source printed circuit board according to another embodiment. FIG. 17 is a cross-sectional view of a second source printed circuit board according to another embodiment.

The detailed description of the first source printed circuit board 310_1 in FIG. 16 has been provided with reference to FIG. 9 and therefore omitted hereinbelow. The first source printed circuit board 310_1 may include the first portion 310a, the second portion 310b, and the third portion 310c. The first portion 310a may have a first thickness t1. The second portion 310b and the third portion 310c may each have a second thickness t2 that is greater than the first thickness t1. The second thickness t2 may be designed to be larger than the first thickness t1 in order to reduce the distance d between the first source printed circuit board 310_1 and the backside 100b of the display panel 100_1. (t1<t2)

With reference to FIG. 17, the second source printed circuit board 350_2 may include a first portion 350a, a second portion 350b, and a third portion 350c. The first portion 350a may have a first thickness t1, and the second portion 350b and the third portion 350c may have a second thicknesses t2 greater than the first thickness t1. The second thickness t2 may be formed to be greater than the first thickness t1 in order to reduce the distance d_1 between the second source printed circuit board 350_1 and the backside 100b of the display panel 100_1, as described with reference to FIG. 15.

The first portion 350a may be positioned between the second portion 350b and the third portion 350c. The first portion 350a may be positioned in the central area, and the second portion 350b and the third portion 350c may be positioned in the outer areas. The second portion 350b and the third portion 350c may directly contact the backside 100b by having the second thickness t2.

In this embodiment, the second portion 350b and the third portion 350c have the second thickness t2 so as to directly contact the backside 100b, advantageously minimizing or at least reducing the bending stress caused by the bending of the display panel 100_1 in the second source printed circuit board 350_2.

Although embodiments of this specification have been described above with reference to the accompanying drawings, it will be understood by those skilled in the art that this specification can be implemented in other specific forms without departing from the technical concept or essential features of this specification. Therefore, it should be understood that the embodiments described above are exemplary and not limited in all respects.

A display apparatus according to an embodiment of this specification includes a display panel including a frontside, a backside, a first side extended along a first direction and a second side extended along a second direction intersecting the first direction, a chip-on-film attached to the frontside of the display panel at the first side, and a source printed circuit board connected to the chip-on-film, wherein the first side is curved in a thickness direction of the display panel, the first source printed circuit board includes a third side extended along the second direction and a fourth side extended along the first direction, the fourth side having a length shorter than a length of the third side.

The display panel may be curved in a direction from the backside to the frontside.

The chip-on-film may be bent from the frontside of the display panel.

The source printed circuit board may be positioned on the backside of the display panel.

The source printed circuit board may comprise a first portion, a second portion and a third portion, the first portion may be positioned between the second portion and the third portion, and the first portion may contact the backside of the display panel.

A thickness of the first portion may be smaller than a thickness of each of the second portion and the third portion.

The second portion and the third portion may be spaced apart from the backside of the display panel.

At least one of the second portion and the third portion may contact the backside of the display panel.

The display apparatus may further comprise a control printed circuit board connected to the source printed circuit board, the control printed circuit board may comprise a fifth side extending along the first direction and a sixth side extending along the second direction, the fifth side being shorter in length than the sixth side.

The display apparatus may further comprise a cable connecting the source printed circuit board and the control printed circuit board, the cable may extend in the first direction and comprise a connector at each of both ends thereof.

The cable may be arranged as multiple in the second direction.

The chip-on-film may be arranged as multiple in the first direction, and the source printed circuit board may be arranged as multiple in the first direction.

A display apparatus according to another embodiment of this specification includes a display panel including a frontside, a backside, a first side extended along a first direction and a second side extended along a second direction intersecting the first direction, a first chip-on-film attached to the frontside of the display panel at the first side, a second chip-on-film attached to the frontside of the display panel at the first side and spaced apart from the first chip-on-film in the first direction, a first source printed circuit board connected to the first chip-on-film, and a second source printed circuit board connected to the second chip-on-film, wherein the first side is curved in a thickness direction of the display panel, the first source printed circuit board includes a third side extended along the second direction and a fourth side extended along the first direction, the fourth side having a length shorter than a length of the third side.

The second source printed circuit board may comprise a fifth side extended along the second direction and a sixth side extended along the first direction, the sixth side having a length shorter than a length of the fifth side.

The display panel may comprise a first curvature region having a first curvature radius and a second curvature region having a second curvature radius, the first curvature radius being greater than the second curvature radius, the first chip-on-film may be attached to the first curvature region, and the second chip-on-film may be attached to the second curvature region, the length of the fourth side of the first source printed circuit board may be greater than the length of the sixth side of the second source printed circuit board.

The display apparatus may further include a control printed circuit board positioned between the first source printed circuit board and the second source printed circuit board.

The control printed circuit board may comprise a seventh side extended along the first direction and a eighth side extended along the second direction, the seventh side having a length shorter than a length of the eighth side The first source printed circuit board, the second source printed circuit board, and the control printed circuit board may be positioned on the backside of the display panel.

The display apparatus may further include a first cable connecting the first source printed circuit board and the control printed circuit board, and a second cable connecting the second source printed circuit board and the control printed circuit board.

the first cable and the second cable may each extends along the first direction.

At least one of the first cable and the second cable may be arranged as multiple in the second direction.

The first source printed circuit board may comprise a first portion, a second portion and a third portion, the first portion may be positioned between the second portion and the third portion, and a thickness of the first portion may be smaller than a thickness of each of the second portion and the third portion.

The second source printed circuit board may comprises a first portion, a second portion and a third portion, the first portion may be positioned between the second portion and the third portion, and a thickness of the first portion may be smaller than a thickness of each of the second portion and the third portion.

DESCRIPTION OF REFERENCE NUMERALS 1, 2: display apparatus 100: display panel
210: first chip-on-film
250: second chip-on-film
310: first source printed circuit board
350: second source printed circuit board
400: control printed circuit board
What is claimed is:

1. A display apparatus, comprising:
a display panel comprising a frontside, a backside, a first side extended along a first direction, and a second side extended along a second direction intersecting the first direction;
a chip-on-film attached to the frontside of the display panel at the first side and bent from the frontside toward the backside of the display panel; and
a source printed circuit board connected to the chip-on-film and overlapping with the backside of the display panel,
wherein the first side is curved in a thickness direction of the display panel,
wherein the source printed circuit board comprises a third side extended along the second direction and a fourth side extended along the first direction, the fourth side having a length that is shorter than a length of the third side, and
wherein an entire portion of the display panel overlapping the chip-on-film and the source printed circuit board in a plan view of the display apparatus is bent.

2. The display apparatus of claim 1, wherein the display panel is curved in a direction from the backside to the frontside.

3. The display apparatus of claim 1, wherein the source printed circuit board is on the backside of the display panel.

4. The display apparatus of claim 3, wherein the source printed circuit board comprises a first portion, a second portion, and a third portion, the first portion between the second portion and the third portion, and the first portion contacts the backside of the display panel.

5. The display apparatus of claim 4, wherein a thickness of the first portion is less than a thickness of the second portion and a thickness of the third portion.

6. The display apparatus of claim 5, wherein at least one of the second portion and the third portion contacts the backside of the display panel.

7. The display apparatus of claim 1, further comprising:
a control printed circuit board connected to the source printed circuit board, the control printed circuit board comprising a fifth side extending along the first direction and a sixth side extending along the second direction, the fifth side having a length that is shorter than a length of the sixth side.

8. The display apparatus of claim 7, further comprising:
a cable connecting the source printed circuit board and the control printed circuit board, the cable extending in the first direction and comprises a connector at each of both ends of the cable.

9. The display apparatus of claim 8, wherein the cable comprises a plurality of cables in the second direction.

10. The display apparatus of claim 1, wherein the chip-on-film comprises a plurality of chip-on-films in the first direction, and the source printed circuit board comprises a plurality of source printed circuit boards in the first direction.

11. A display apparatus, comprising:
a display panel comprising a frontside, a backside, a first side extended along a first direction, and a second side extended along a second direction intersecting the first direction;
a chip-on-film attached to the frontside of the display panel at the first side and bent from the frontside toward the backside of the display panel; and
a source printed circuit board connected to the chip-on-film and overlapping with the backside of the display panel,
wherein the first side is curved in a thickness direction of the display panel,
wherein the source printed circuit board comprises a third side extended along the second direction and a fourth side extended along the first direction, the fourth side having a length that is shorter than a length of the third side,
wherein the chip-on-film overlaps with the curved first side of the display panel in a plan view of the display apparatus, and
wherein a portion of the source printed circuit board is spaced apart from the backside of the display panel.

12. A display apparatus, comprising:
a display panel comprising a frontside, a backside, a first side extended along a first direction, and a second side extended along a second direction intersecting the first direction;
a first chip-on-film attached to the frontside of the display panel at the first side and bent from the frontside toward the backside of the display panel;

a second chip-on-film attached to the frontside of the display panel at the first side and spaced apart from the first chip-on-film in the first direction;

a first source printed circuit board connected to the first chip-on-film and overlapping with the backside of the display panel; and a second source printed circuit board connected to the second chip-on-film, wherein the first side is curved in a thickness direction of the display panel, wherein the first source printed circuit board comprises a third side extended along the second direction and a fourth side extended along the first direction, the fourth side having a length that is shorter than a length of the third side, and wherein an entire portion of the display panel individually overlapping each of the first chip-on-film, the second chip-on-film, the first source printed circuit board and the second source printed circuit board in a plan view of the display apparatus is bent.

13. The display apparatus of claim 12, wherein the second source printed circuit board comprises a fifth side extended along the second direction and a sixth side extended along the first direction, the sixth side having a length that is shorter than a length of the fifth side.

14. The display apparatus of claim 13, wherein the display panel comprises a first curvature region having a first curvature radius and a second curvature region having a second curvature radius, the first curvature radius greater than the second curvature radius, the first chip-on-film is attached to the first curvature region, and the second chip-on-film is attached to the second curvature region, the length of the fourth side of the first source printed circuit board is greater than the length of the sixth side of the second source printed circuit board.

15. The display apparatus of claim 13, wherein the second source printed circuit board comprises a first portion, a second portion, and a third portion, the first portion positioned between the second portion and the third portion, and wherein a thickness of the first portion is less than a thickness of each of the second portion and the third portion.

16. The display apparatus of claim 12, further comprising:

a control printed circuit board positioned between the first source printed circuit board and the second source printed circuit board, wherein the control printed circuit board comprises a seventh side extended along the first direction and a eighth side extended along the second direction, the seventh side having a length that is shorter than a length of the eighth side.

17. The display apparatus of claim 16, wherein the first source printed circuit board, the second source printed circuit board, and the control printed circuit board are on the backside of the display panel.

18. The display apparatus of claim 16, further comprising:

a first cable connecting the first source printed circuit board and the control printed circuit board, and a second cable connecting the second source printed circuit board and the control printed circuit board, wherein the first cable and the second cable each extends along the first direction.

19. The display apparatus of claim 18, wherein at least one of the first cable and the second cable comprises a plurality of cables in the second direction.

20. The display apparatus of claim 12, wherein the first source printed circuit board comprises a first portion, a second portion, and a third portion, the first portion positioned between the second portion and the third portion, and wherein a thickness of the first portion is less than a thickness of the second portion and a thickness of the third portion.

* * * * *